United States Patent [19]

Taguchi et al.

[11] Patent Number: 5,785,753
[45] Date of Patent: Jul. 28, 1998

[54] SINGLE CRYSTAL MANUFACTURING METHOD

[75] Inventors: Yasujiro Taguchi, Tokyo; Tsutomu Okamoto, Kanagawa, both of Japan

[73] Assignee: Sony Corporation, Japan

[21] Appl. No.: 555,787

[22] Filed: Nov. 9, 1995

[30] Foreign Application Priority Data

Nov. 14, 1994 [JP] Japan ............................ 6-279339

[51] Int. Cl.$^6$ .......................................... C30B 15/20
[52] U.S. Cl. ........................ 117/36; 117/15; 117/22; 117/931
[58] Field of Search ....................... 117/2, 3, 13, 22, 117/36, 904, 15, 931; 423/277, 285, 583

[56] References Cited

U.S. PATENT DOCUMENTS 5,251,059  10/1993  Kouta ................................. 359/326
5,454,345  10/1995  Kouta et al. ........................ 117/13

OTHER PUBLICATIONS

"Mestastable Crystal Growth of the Low Temperature Phase of Barium Metaborate From the Melt"; Kôzuki, et al; *J. Cryst Growth* 114 (1991) pp. 683–686.

"Flux Growth of Large Single Crystals of Low Temperature Barium Metaborate"; Jiang, et al.; *J. of Cryst Growth* 79 (1986) pp. 963–969.

*Primary Examiner*—Felisa Garrett
*Attorney, Agent, or Firm*—Ronald P. Kananen

[57] ABSTRACT

In a single-crystal manufacturing method, after a single crystal is grown, the crystal is separated from the molten melt and gradually cooled while suspended immediately above the surface of the melt. During this cooling, a measure, which produces solidification of the melt, is locally applied. As a result, the solidification of the melt is selectively forced so that at least the melt forms a crust and prevents the crystal, should it fall, from becoming immersed in molten melt. This measure also protects the crystal from any sudden release of heat such as tends to occur if the melt becomes supercooled prior to the onset of crystallization.

7 Claims, 1 Drawing Sheet

SINGLE CRYSTAL MANUFACTURING METHOD

BACKGROUND OF THE INVENTION

1. Field of the Invention

The present invention relates to a single-crystal manufacturing method in which a single crystal is grown from a melt by crystal pulling. More specifically, the present invention relates to a single-crystal manufacturing method suitable for application to a process of growing a low-temperature-phase $BaB_2O_4$ ($\beta$-$BaB_2O_4$) single crystal by crystal pulling.

2. Description of the Related Art

In the field of optics, a technique for recording on a compact disk (CD) with increased density requires a source of laser light having a short wavelength. In order to obtain a source of laser light having such a short wavelength, a lot of research has been directed to shortening the wavelength of existing solid-state lasers, using a non-linear optical material.

These nonlinear optical materials are required to have a large nonlinear optical effect and strong resistance to damage by laser light.

Among such nonlinear optical materials, is a low-temperature-phase $BaB_2O_4$ ($\beta$-$BaB_2O_4$) crystal which can convert the wavelength of laser light to one that falls in the ultraviolet region and which is immune to damage by laser light. Therefore, it is desirable to be able to grow the low-temperature-phase $BaB_2O_4$ ($\beta$-$BaB_2O_4$) crystal in both large quantity and high quality.

This has encouraged a lot of research on growing the low-temperature-phase $BaB_2O_4$ ($\beta$-$BaB_2O_4$) crystal in various optical fields. $BaB_2O_4$ has a composition exhibiting congruent melting but has two phases, i.e., a high-temperature-phase $BaB_2O_4$ ($\alpha$-$BaB_2O_4$) and the low-temperature-phase $BaB_2O_4$ ($\beta$-$BaB_2O_4$), and is changed from one phase to the other phase at a phase transition point of about 925° C. (see JIANG Aidong et al. Journal of Crystal Growth, vol. 79 (1986), P963–969). Therefore, it is considered difficult to grow the low temperature-phase $BaB_2O_4$ ($\beta$-$BaB_2O_4$) crystal using normal crystal pulling techniques.

With a flux such as $Na_2O$ and the like, the melting point of $BaB_2O_4$ is lowered to a temperature at which the low temperature-phase $BaB_2O_4$ ($\beta$-$BaB_2O_4$) crystallizes. In such a situation, the low-temperature-phase $BaB_2O_4$ ($\beta$-$BaB_2O_4$) crystal is grown using suitable flux growth methods such as the so called Top Seeded Solution Growth (TSSG), flux pulling method, and the like. In this case, however, problems are encountered in that its growth rate is very slow and that, since a flux component is mixed in the low-temperature-phase $BaB_2O_4$ ($\beta$-$BaB_2O_4$) crystal, it is difficult to grow high-quality low temperature-phase $BaB_2O_4$ ($\beta$-$BaB_2O_4$) crystal.

Recently, it has been revealed that it is possible to grow the low-temperature-phase $BaB_2O_4$ ($\beta$-$BaB_2O_4$) type crystal using a crystal pulling technique known as the Czokralski method. In this technique, the crystal is pulled from a melt of $BaB_2O_4$ to which no flux has been added (see Japanese laid-open patent publication No. 172891/1990). Since the low-temperature-phase $BaB_2O_4$ crystal grown using the Czokralski method does not contain any flux, it can be expected to yield a high-quality low-temperature-phase $BaB_2O_4$ ($\beta$-$BaB_2O_4$) crystal. The low-temperature-phase $BaB_2O_4$ ($\beta$-$BaB_2O_4$) crystal enjoys the advantages that its growth rate is fast and a large-sized crystal can be obtained. Therefore, recently, the low-temperature-phase $BaB_2O_4$ ($\beta$-$BaB_2O_4$) crystal is frequently grown using the Czokralski method.

When a crystal is grown using the Czokralski method, the crystal is grown until it has a desired length. Then, the crystal is separated from melt and suspended over the crucible in which the melt is contained. That is to say, the crystal is suspended immediately above the melt surface so as to be spaced therefrom by a gap of several mm. The suspended crystal is gradually cooled at a cooling rate of 50° C./hour, for example. This cooling process is also employed when growing the low-temperature-phase $BaB_2O_4$ ($\beta$-$BaB_2O_4$) type of crystal.

However, when the low-temperature-phase $BaB_2O_4$ ($\beta$-$BaB_2O_4$) single crystal is grown, the gradual cooling while suspended immediately above the melt induces problems. Specifically, a seed crystal made of the low-temperature-phase $BaB_2O_4$ ($\beta$-$BaB_2O_4$) has a cleavage plane on its c-plane and tends to be cleaved along this c-plane. Therefore, when the crystal is pulled in the c-axis direction and gradually cooled while suspended over the melt, the seed crystal tends break and allow the grown crystal to fall back into the molten melt. In this case, if the melt has not solidified, then the crystal sinks and comes immersed to the degree that it is impossible to recover it from the melt. Even if the grown crystal does not fall into the melt before the melt solidifies, there is still a possibility that a different type of problem will be encountered. That is to say, the melt having the composition of $BaB_2O_4$ can supercool to a temperature which is about 200° C. below its melting point. Once the supercooled melt begins to solidify, its solidification progresses rapidly and the heat of crystallization released by this solidification increases the temperature of the grown crystal by about 50° C. This damages the grown crystal and leads to a lowered crystallinity and the generation of crystal defects and the like.

SUMMARY OF THE INVENTION

It is therefore a primary object of the present invention is to solve the above-mentioned problems, i.e., the problem wherein it is impossible to withdraw the grown crystal which has fallen back into the melt, and the problem that when the grown crystal does not fall into the melt, the temperature of the grown crystal can be rapidly changed by rapid solidification of a supercooled melt.

A second object of the present invention is to obtain a low-temperature-phase $BaB_2O_4$ ($\beta$-$BaB_2O_4$) single flux free crystal having excellent crystallinity with a satisfactory yield.

According to a first aspect of the present invention, a single crystal is grown from a melt by crystal pulling. After the single crystal is grown, the grown single crystal is withdrawn from a surface of the melt and gradually cooled while being suspended over the surface of the melt at a predetermined interval. While the grown single crystal is cooled gradually, a factor to produce solidification of the melt is locally supplied from an outside to the melt. As a result, the solidification of the melt is forcibly started from a part thereof supplied with the factor and spreads to other parts thereof.

According to a second aspect of the present invention, a method of supplying the factor to produce solidification of the melt is to supply a crystal piece serving as a core or nucleus of solidification of the melt.

According to a third aspect of the present invention, the above melt is a melt having a composition of $BaB_2O_4$ and no flux mixed therein and a low-temperature-phase $P$-$BaB_2O_4$ single crystal is grown from the melt by crystal pulling.

DESCRIPTION OF THE PREFERRED EMBODIMENT

Figure 1:
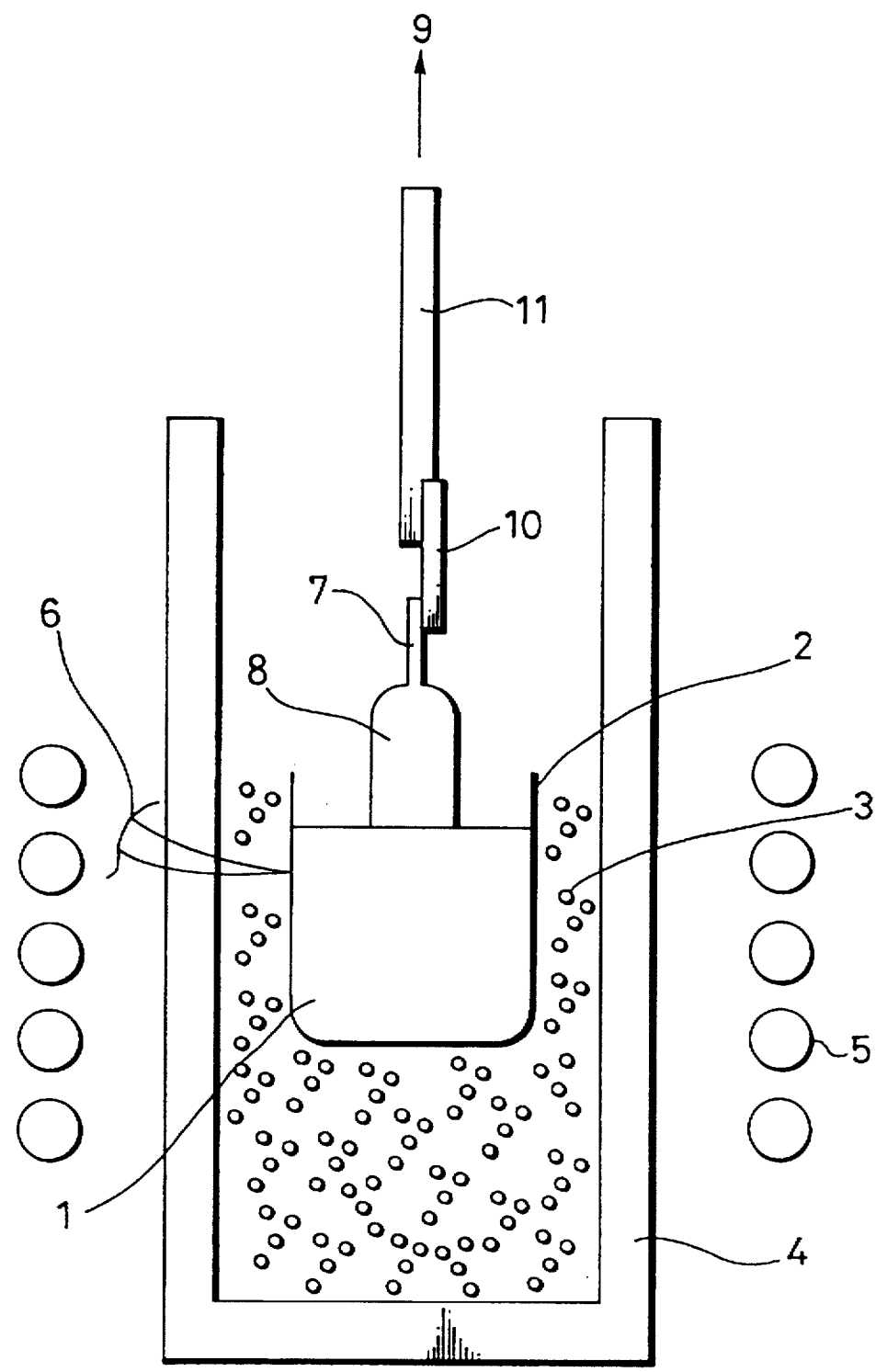
FIG. 1 is a schematic diagram showing an arrangement of a single-crystal growing device in which a single crystal is grown by a method according to the present invention.

An arrangement of a single-crystal growing device in which a single crystal is grown using a method according to the present invention will be described with reference to FIG. 1.

The single-crystal growing device includes a crucible 2 made of platinum, aluminum balls 3, a furnace 4 made of aluminum, a high-frequency coil 5, a thermocouple 6, a rotating and pulling mechanism 9, a platinum square rod 10 and a sapphire rod 11. The platinum crucible 2 is disposed in the furnace 4. The crucible 2 is kept at a predetermined temperature and contains a melt 1 having a composition of $BaB_2O_4$. The aluminum balls 3 are disposed in the aluminum furnace 4. The aluminum balls 3 and the aluminum furnace 4 support the platinum crucible 2. The high-frequency coil 5 is disposed outside the furnace 4 and heats the platinum crucible 2 by induction heating to heat the melt 1. The temperature detecting thermocouple 6 is connected to the crucible 2 and controls the temperature in the crucible 2. The rotating and pulling mechanism 9 is disposed above the furnace 4 to withdraw a low-temperature-phase $BaB_2O_4$ ($\beta$-$BaB_2O_4$ single crystal 8 from the melt 1 while rotating a seed crystal 7. The seed crystal 7 is attached to a head end of the rotating and pulling mechanism 9 through the platinum square rod 10 and the sapphire rod 11.

According to the method of the present invention, after a process of growing a single crystal, a forced melt solidification process is employed. Specifically, the grown single crystal is withdrawn from a surface of a melt and suspended immediately over the melt so that a predetermined interval or gap is defined between the surface of the melt and the bottom of the crystal. While being suspended as described above, the grown single crystal is gradually cooled. At this time, at least at an initial stage of this cooling process, a solidification inducing nucleus or a measure to produce such a nucleus, is locally applied to the melt to forcibly start the solidification process from the point at which the nucleus or corresponding nucleus inducing measure is applied. This solidification spreads throughout the melt.

INVENTIVE EXAMPLE

The low-temperature-phase $BaB_2O_4$ ($\beta$-$BaB_2O_4$) single crystal is grown by the above single-crystal growing device as follows.

In the inventive example, $BaCO_3$ and $BaO_3$ having purities of 99.99% were employed as starting materials and mixed in a molar ratio of 1:1, thereby preparing a $BaB_2O_4$ compound with a weight of about 160 g. The compound was disposed in the platinum crucible 2.

A 2-mm square c-axis oriented rod with a length of 10 mm was employed as the seed crystal 7. The single crystal 8 was grown in an air atmosphere for six hours under the conditions wherein a rotation speed of the seed crystal 7 was set to 14 rpm and a withdrawal rate thereof was set to 3 mm/hour.

After the single crystal 8 was grown, the single crystal 8 was withdrawn until it broke away from the surface of the melt 1 and was spaced above the surface of the melt 1 by about 5 mm. While the single crystal 8 was being suspended immediately over the melt 1, a process of cooling the single crystal 8 was started to produce a cooling rate of 50° C./hour with the grown single crystal 8 being rotated.

When a temperature of the melt 1 was lowered to a temperature which is 20° C. below that measured when the crystal growth was terminated, a piece of $\beta$-$BaB_2O_4$ crystal having the same composition as that of the melt 1 was dropped into the melt 1 as a germ or nucleus for inducing the melt 1 to solidify. At this time, the melt 1 began to solidify from the point of entry of the nucleus. When the temperature of the melt 1 was lowered to a temperature which was 50° C. below that measured when the crystal growth was finished, the whole surface of the melt 1 had solidified over. The cooling process was continued under these conditions. When the temperature of the melt 1 was lowered to a temperature which is about 100° C. below that measured when the crystal growth was terminated, the seed crystal 7 was broken and the single crystal 8 was allowed to fall. However, since the melt 1 in the crucible 2 had already solidified at this time, the crystal 8 was prevented from becoming immersed in molten melt 1. While resting on the surface of the solidified melt 1, the grown single crystal 8 was permitted to cool to room temperature. Then, the grown single crystal 8 was removed from the crucible 2. It was confirmed using an X-ray technique that the crystal was $\beta$-$BaB_2O_4$.

Comparative Example

The $\beta$-$BaB_2O_4$ single crystal was grown using the same device and under the same conditions as the inventive example. After the growth of the $\beta$-$BaB_2O_4$ single crystal was completed, the grown crystal was withdrawn from the surface of the melt 1 and suspended over the melt 1 similarly to the inventive example. The $\beta$-$BaB_2O_4$ single crystal was cooled gradually at a cooling rate of 50° C./hour similarly to the inventive example. During this gradual cooling process, no special process of artificially inducing a nucleus to trigger solidification of the melt 1 or any other external measure to produce such nucleus was employed. When the temperature of the melt 1 was lowered to a temperature which was about 65° C. below that measured when the crystal growth was finished, the seed crystal 7 was broken and the grown single crystal 8 was permitted to fall into the melt 1. The melt 1 began to solidified instantaneously. As the melt 1 solidified, the grown crystal 8 sank so that only the top portion projected from the surface of the solidified melt 1. Since the grown single crystal 8 was almost buried in a solidified portion of the melt 1, it was impossible to recover it.

As is clear from the above, according to the method of the present invention, since at least the surface of the melt is forcibly solidified by some suitable externally applied means, even if the grown single crystal falls down during the gradual cooling process, it is possible to prevent the grown single crystal from becoming buried in the melt, and allows the recovery of the grown single crystal. Accordingly, it is possible to prevent the such a problem from lowering the crystal yield.

Further, since the melt solidifies gradually following the externally induced initiation of melt solidification, it is possible to avoid the radiation of the heat of crystallization produced by rapid solidification of a supercooled melt. As a result, it is possible to avoid temperature changes in the crystal during the gradual cooling process. Accordingly, it is possible to finally obtain the $\beta$-$BaB_2O_4$ single crystal with excellent crystallinity.

While in the inventive example the solidification of the melt is forcibly started by dropping a piece of crystal into the melt to start the crystallization (polycrystallization with the crystal piece serving as the nucleus of the crystallization), and the crystallization spreads through the entirety of the melt, the present invention is not limited to this particular technique. The solidification of the melt in the present invention involves not only solidification caused by the crystallization (polycrystallization) of the melt but also the formation of a mere solid phase of the melt. The supply of the nucleus or the measure to produce the nucleus are just examples of external means which can be used to start the solidification process. For example, during the growth of the β-BaB$_2$O$_4$ single crystal, the melt may be solidified by contacting or immersing a material (e.g. a probe) which does not damage or contaminate the melt, e.g., a metallic nucleus material such as Pt or other suitable inorganic solid which can be brought into contact with the melt; or by locally cooling the melt such as by blowing cold air onto the surface of the melt.

The present invention is not limited to the cooling rate, the rotation speed, the interval between the grown signal crystal and the surface of the melt and so on, set in the above embodiment, and may be increased or decreased.

As described above, according to the present invention, after the process of growing the single crystal from the melt is finished, the melt is forcibly solidified by supplying a nucleus or by applying external means produce the nucleus. Therefore, it is possible to solve the problems presented when the β-BaB$_2$O$_4$ single crystal is grown by crystal pulling in which the grown crystal is pulled out of the melt having a composition of BaB$_2$O$_4$ which contains no flux, i.e., the problems presented during the gradual cooling process in which the single crystal is cooled while being suspended over the crucible, i.e., immediately over the melt. Specifically, it is possible to solve the problem wherein grown single crystal becomes permanently buried in the melt if the grown single crystal accidentally drops thereinto, and it is also possible to prevent the crystallinity of the grown crystal from being lowered by the heat of crystallization produced by the rapid solidification of a supercooled melt.

Accordingly, according to the method of the present invention, as the β-BaB$_2$O$_4$ single crystal is grown by crystal pulling from a flux free melt of BaB$_2$O$_{41}$ it is possible to obtain a β-BaB$_2$O$_4$ single crystal with excellent crystallinity and satisfactory yield rate, which brings considerable industrial advantages.

It is to be understood that the present invention is not limited to the above-mentioned embodiment and that various changes and modifications can be effected therein by one skilled in the art without departing from the spirit or scope of the present invention as defined in the appended claims.

What is claimed is:

1. A single-crystal manufacturing method in which a single crystal is grown from a melt by a crystal pulling, comprising the steps of:

growing a single crystal;

withdrawing, after said single crystal is grown, said grown single crystal to a position wherein it is suspended at a distance above a surface of said melt to gradually cool said grown single crystal;

separating said grown single crystal from said melt; and introducing a stimulus for forcibly starting a solidification process of the melt while said grown single crystal is suspended over the surface of said melt and cooled, so as to induce solidification of said melt, said stimulus being locally applied to said melt.

2. A single-crystal manufacturing method according to claim 1, wherein the step of forcibly starting the solidification of said melt comprises introducing a crystal piece into the melt which serves as a nucleus of solidification of said melt.

3. A single-crystal manufacturing method according to claim 1, wherein said melt has a composition of BaB$_2$O$_4$, wherein said melt contains no flux, and wherein a low-temperature-phase β-BaB$_2$O$_4$ single crystal is grown from said melt by crystal pulling.

4. A crystal manufacturing method comprising the steps of:

growing a single crystal;

withdrawing, after said single crystal is grown, said grown single crystal from a flux free melt of BaB$_2$O$_4$;

separating the crystal from the melt;

suspending the crystal above a surface of the melt so as to be separated from the surface of the melt;

allowing a temperature differential to be established between the temperature of the crystal and the temperature of the melt; and initiating solidification of the melt by introducing a nucleus about which solidification proliferates at least over the surface of the melt, to prevent accidental immersion of the single crystal in molten melt and to prevent the melt from becoming supercooled and undergoing very rapid crystallization with an attendant release of heat which can modify the crystal structure of the single crystal suspended above the surface of the melt.

5. A method as set forth in claim 4, wherein the step of initiating solidification comprises the step of introducing a crystal of BaB$_2$O$_4$.

6. A method as set forth in claim 4, wherein the step of initiating solidification comprises the step of contacting the melt with a material which has no effect on the purity of the melt, into the melt to form a crystal which acts as a crystallization nucleus.

7. A method as set forth in claim 4, wherein the step of initiating solidification comprises the step of locally cooling a portion of the melt by blowing air on the surface of the melt.

* * * * *